(12) United States Patent
Chou (10) Patent No.: US 9,780,022 B2
(45) Date of Patent: Oct. 3, 2017

(54) SUBSTRATE STRUCTURE

(71) Applicant: Phoenix Pioneer Technology Co., Ltd., Hsinchu County (TW)

(72) Inventor: Pao-Hung Chou, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 15/206,511

(22) Filed: Jul. 11, 2016

(65) Prior Publication Data

US 2017/0018491 A1    Jan. 19, 2017

(30) Foreign Application Priority Data

Jul. 15, 2015  (CN) .......................... 2015 1 0413885

(51) Int. Cl.
*H05K 1/00* (2006.01)
*H01L 23/498* (2006.01)
(Continued)

(52) U.S. Cl.
CPC ...... *H01L 23/49827* (2013.01); *H01L 21/486* (2013.01); *H01L 21/565* (2013.01);
(Continued)

(58) Field of Classification Search
CPC ... H05K 1/11; H05K 3/02; H05K 3/06; H05K 3/10; H05K 3/30; H05K 3/40; H05K 3/42;
(Continued)

(56) References Cited

U.S. PATENT DOCUMENTS 4,673,773 A * 6/1987 Nakano ................ C08G 69/265
174/258
5,576,630 A * 11/1996 Fujita ................. G01R 31/2886
324/754.07
(Continued)

FOREIGN PATENT DOCUMENTS

TW          200943508 A       10/2009
TW          201039416 A       11/2010
(Continued)

*Primary Examiner* — Xiaoliang Chen
(74) *Attorney, Agent, or Firm* — McClure, Qualey & Rodack, LLP (57) ABSTRACT

A substrate structure and a manufacturing method thereof are provided. The substrate structure comprises a dielectric material layer, a first conductive wiring layer, a second conductive wiring layer, a first conductive pillar layer, and a second conductive pillar layer. The first conductive wiring layer is disposed inside the dielectric material layer. The first conductive pillar layer having a first conductive pillar is disposed inside the dielectric material layer and between the first conductive wiring layer and the second conductive wiring layer. The second conductive pillar layer having a second conductive pillar is disposed on the second conductive wiring layer. The first conductive wiring layer and the second conductive wiring layer are electrically connected by the first conductive pillar layer. The second conductive pillar is a ⊥-shape conductive pillar, a ⊤-shape conductive pillar, or a ✚-shape conductive pillar.

6 Claims, 12 Drawing Sheets

(51) Int. Cl.
  *H01L 21/56* (2006.01)
  *H01L 21/48* (2006.01)
  *H01L 21/683* (2006.01)
(52) U.S. Cl.
  CPC .... *H01L 21/6835* (2013.01); *H01L 23/49811* (2013.01); *H01L 23/49838* (2013.01); *H01L 23/49894* (2013.01); *H01L 2221/68345* (2013.01); *H01L 2221/68359* (2013.01)
(58) Field of Classification Search
  CPC . H05K 3/44; H05K 3/46; H01L 21/00; H01L 21/02; H01L 21/28; H01L 21/44; H01L 21/48; H01L 21/50; H01L 21/67; H01L 21/68; H01L 21/71; H01L 21/76; H01L 23/02; H01L 23/12; H01L 23/48
  USPC ....... 174/258, 251, 255, 257, 261, 262, 264, 174/266; 361/58, 708, 768; 257/98, 100, 257/686, 690, 700, 758, 774; 438/118, 438/386, 613, 622, 637
  See application file for complete search history.

(56) References Cited

U.S. PATENT DOCUMENTS

| | | | | |
|---|---|---|---|---|
| 5,886,877 | A * | 3/1999 | Shingai | H01L 21/4853 174/255 |
| 6,300,576 | B1 * | 10/2001 | Nakamura | H01L 21/4853 174/261 |
| 7,640,655 | B2 * | 1/2010 | Sunohara | H01L 23/5385 174/258 |
| 8,946,906 | B2 * | 2/2015 | Maeda | H05K 1/115 257/739 |
| 9,214,437 | B1 | 12/2015 | Hsu et al. | |
| 2004/0140551 | A1 * | 7/2004 | Usui | H01L 21/6835 257/700 |
| 2004/0178492 | A1 * | 9/2004 | Tsukamoto | H01L 23/49822 257/690 |
| 2004/0237299 | A1 * | 12/2004 | Stelzl | H01L 21/50 29/855 |
| 2004/0265482 | A1 * | 12/2004 | Horikawa | H01L 21/486 427/96.1 |
| 2005/0026419 | A1 * | 2/2005 | Yudasaka | H01L 21/76802 438/620 |
| 2005/0155791 | A1 * | 7/2005 | Saiki | H01L 23/49822 174/262 |
| 2005/0155792 | A1 * | 7/2005 | Ito | H05K 3/4069 174/264 |
| 2005/0218502 | A1 * | 10/2005 | Sunohara | H01L 23/49822 257/700 |
| 2005/0230835 | A1 * | 10/2005 | Sunohara | H01L 23/5389 257/758 |
| 2005/0247665 | A1 * | 11/2005 | Oi | H01L 21/4857 216/13 |
| 2005/0258447 | A1 * | 11/2005 | Oi | H01L 23/5389 257/100 |
| 2006/0009026 | A1 * | 1/2006 | Sawaguchi | H05K 3/465 438/622 |
| 2006/0083895 | A1 * | 4/2006 | Ikeda | B32B 3/10 428/137 |
| 2006/0158804 | A1 * | 7/2006 | Usui | H01L 21/568 361/58 |
| 2007/0262452 | A1 * | 11/2007 | Oi | H01L 23/5389 257/758 |
| 2007/0281394 | A1 * | 12/2007 | Kawabe | H01L 21/4857 438/118 |
| 2008/0029294 | A1 * | 2/2008 | Kawamura | H05K 3/381 174/261 |
| 2009/0100673 | A1 * | 4/2009 | Yukiiri | H05K 3/421 29/846 |
| 2009/0130838 | A1 * | 5/2009 | Sakaguchi | H01L 21/4853 438/613 |
| 2009/0146283 | A1 * | 6/2009 | Chen | H01L 25/0657 257/686 |
| 2009/0236686 | A1 * | 9/2009 | Shim | H01L 21/568 257/528 |
| 2009/0280617 | A1 * | 11/2009 | Cheng | H05K 1/165 438/386 |
| 2010/0147576 | A1 * | 6/2010 | Hondo | H05K 3/4069 174/266 |
| 2011/0016709 | A1 * | 1/2011 | Mizutani | H05K 3/108 29/847 |
| 2012/0120609 | A1 * | 5/2012 | Chou | H01L 21/568 361/708 |
| 2012/0261689 | A1 * | 10/2012 | Appelt | H01L 21/4832 257/98 |
| 2013/0049217 | A1 * | 2/2013 | Gong | H01L 23/49822 257/774 |
| 2016/0163626 | A1 * | 6/2016 | Chou | H01L 23/49822 174/251 |

FOREIGN PATENT DOCUMENTS

| | | |
|---|---|---|
| TW | M433634 | 7/2012 |
| TW | I474417 | 2/2015 |

* cited by examiner

SUBSTRATE STRUCTURE

This application claims the benefit of priority based on People's Republic of China Patent Application No 201510413885.2, filed on Jul. 15, 2015, the contents of which are incorporated herein by reference in their entirety.

CROSS-REFERENCES TO RELATED APPLICATIONS

Not applicable.

BACKGROUND OF THE INVENTION

Field of the Invention

This invention is regarding a substrate structure and a manufacturing method thereof. More precisely speaking, this invention is regarding a semiconductor substrate structure and a manufacturing method thereof.

Descriptions of the Related Art

In recent years, users seek electronic products with compact size, high performance and versatility. Electronics manufacturers must accommodate more components in a limited area of an integrated circuit (IC) to achieve high density and miniaturization. Thus, electronics manufacturers develop a new package, such as a flip-chip (FC) package, a chip scale package (CSP), a wafer level package (WLP) and a three-dimensional (3D) package, of the IC.

Electronic circuits for different functions, such as applications of digital, analog, memory or radio frequency, will have different needs and structures. Thus, integration of different functions on a single die is not an optimized solution. The system chip is in a single package, which has multidimensional space architecture, to incorporate different dies with heterogeneous technologies and different operating voltages by the developments of system on chip (SOC) system-in-package (SiP) package-in-package (PiP) package-on-package (PoP), and chip scale package (CSP). Further, the package of the system chip has been advancing toward a three-dimensional package which can integrate dies, packages and passive components in one package.

In prior art, an inter-layer height of a multilayer stack package can be controlled by using rigid conductors as supports. However, an alignment control of the aforementioned method is difficult. Further, the inter-layer height of the multilayer stack package controlled by using solder balls as supports will cause a height restriction, and the upper substrate will suppress the lower components. In the traditional three-dimensional (3D) package, the more layers of the package represent more system modules inside the 3D package, such that heat generated by operation of each system module will result in poor cooling effect of the 3D package. Thus, the reliability of the 3D package will be affected to reduce the yield rate of packaging process.

In view of this, it is important to provide a substrate structure having rigidity and heat dissipation and meeting the high yield rate of packaging process.

SUMMARY OF THE INVENTION

An objective of the present invention is to provide a substrate structure which comprises a dielectric material layer, a first conductive wiring layer, a second conductive wiring layer, a first conductive pillar layer, and a second conductive pillar layer. The first conductive wiring layer is disposed inside the dielectric material layer. The first conductive pillar layer is disposed inside the dielectric material layer and between the first and second conductive wiring layers, and has at least one first conductive pillar. The second conductive pillar layer is disposed on the second conductive wiring layer, and has at least one second conductive pillar. The first conductive wiring layer is electrically connected to the second conductive wiring layer by the at least one first conductive pillar. The at least one second conductive pillar is a ⊥-shape conductive pillar, a ⊤-shape conductive pillar, or a ⊥-shape conductive pillar.

Another objective of the present invention is to provide a manufacturing method of a substrate structure. The manufacturing method comprising the steps of: providing a carrier board having a surface; forming a dielectric material layer on the surface of the carrier board; forming a first conductive wiring layer on the dielectric material layer; forming a first conductive pillar layer on the first conductive wiring layer; forming the dielectric material layer to cause the dielectric material layer to cover the first conductive wiring layer and the first conductive pillar layer; exposing one side of the first conductive pillar layer; forming a second conductive wiring layer on the exposed side of the first conductive pillar layer and the dielectric material layer; forming a second conductive pillar layer, which has at least one conductive pillar, on the second conductive wiring layer; and removing the carrier board. More specifically, the at least one conductive pillar of the second conductive pillar layer is a ⊥-shape conductive pillar.

Further another objective of the present invention is to provide a manufacturing method of a substrate structure. The manufacturing method comprising the steps of: providing a carrier board having a surface; forming a dielectric material layer on the surface of the carrier board; forming a first conductive wiring layer on the dielectric material layer; forming a first conductive pillar layer on the first conductive wiring layer; forming the dielectric material layer to cause the dielectric material layer to cover the first conductive wiring layer and the first conductive pillar layer; exposing one side of the first conductive pillar layer; forming a second conductive wiring layer on the exposed side of the first conductive pillar layer and the dielectric material layer; forming the dielectric material layer on the second conductive wiring layer; exposing one side of the second conductive wiring layer; forming a second conductive pillar layer, which has at least one conductive pillar, on the exposed side of the second conductive wiring layer; and removing the carrier board. More specifically, the at least one conductive pillar of the second conductive pillar layer is a ⊤-shape conductive pillar, or a ⊥-shape conductive pillar.

According to the above description, the substrate structure and manufacturing method of the present invention use a simple manufacturing process to form conductive pillars with different shapes as supports between the inter-layers in a multilayer stack package. Accordingly, the substrate structure and manufacturing method of the present invention reduce a height of the multilayer stack package to achieve the high yield rate of packaging process, and increase rigidity and heat dissipation. Therefore, the processing time and cost of the substrate structure will be significantly reduced.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following description, this invention will be explained with reference to embodiments thereof. However, the description of these embodiments is only for purposes of illustration rather than limitation. It should be appreciated that in the following embodiments and attached drawings, elements unrelated to this invention are omitted from depictions; and dimensional relationships among individual elements in the attached drawings are illustrated only for ease of understanding, but not to limit the actual scale.

Figure 1:
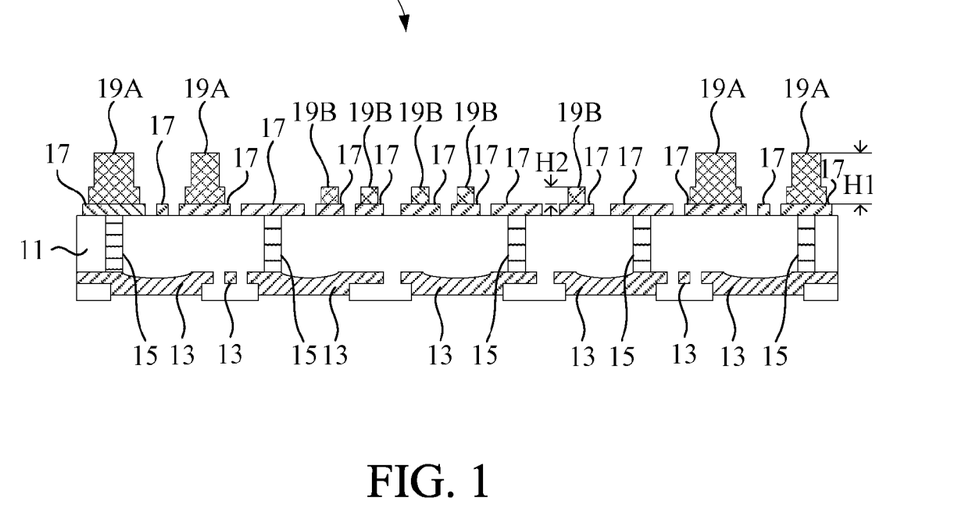
FIG. 1 is a schematic view of the first embodiment of a substrate structure of the present invention.

FIG. 1 depicts a substrate structure 1 of a first embodiment. The substrate structure 1 comprises a dielectric material layer 11, a first conductive wiring layer 13, a first conductive pillar layer 15, a second conductive wiring layer 17, and a second conductive pillar layer. The first conductive pillar layer 15 has a plurality of first conductive pillars. Similarly, the second conductive pillar layer has a plurality of second conductive pillars 19A, 19B. The first conductive wiring layer 13 is disposed in the dielectric material layer 11.

The dielectric material layer 11 is a molding compound layer having novolac-based resin, epoxy-based resin, silicone-based resin, or any molding compound with the same function and well known to those skilled in the art. In the embodiment, the first conductive pillar layer 15 has five first conductive pillars. The second conductive pillar layer has four second conductive pillars 19A and five second conductive pillars 19B. The second conductive pillar 19A has a first height H1 and the second conductive pillar 19B has a second height H2, wherein the second height H2 is less than the first height H1. It should be noted that the first conductive pillar layer 15 and the second conductive pillar layer may individually have any amount of conductive pillars for different needs of the substrate structure 1.

The first conductive pillar layer 15 is disposed inside the dielectric material layer 11 and between the first conductive wiring layer 13 and the second conductive wiring layer 17. Meanwhile, the first conductive pillar layer 15 is electrically connected to the first conductive wiring layer 13 and the second conductive wiring layer 17. The conductive pillars 19A, 19B of the second conductive pillar layer is disposed on second conductive wiring layer 17. Meanwhile, the conductive pillars 19A, 19B of the second conductive pillar layer are electrically connected to the second conductive wiring layer 17. In the embodiment, the conductive pillars 19A of the second conductive pillar layer are ⊥-shaped conductive pillars. The conductive pillars 19B of the second conductive pillar layer are □-shaped conductive pillars.

Figure 2:
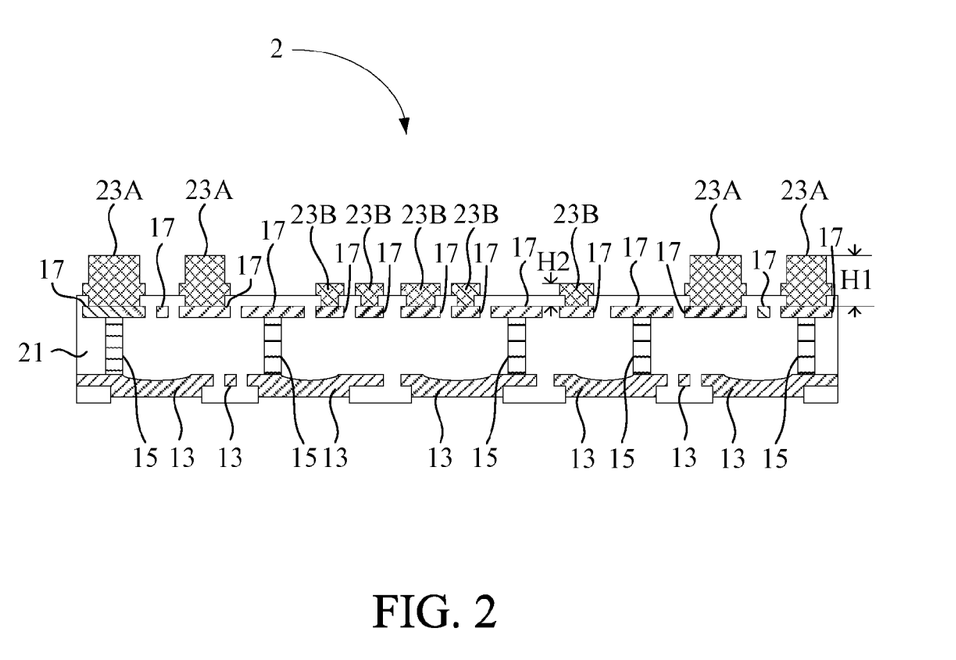
FIG. 2 is a schematic view of the second embodiment of a substrate structure of the present invention.

FIG. 2 depicts a substrate structure 2 of a second embodiment. The substrate structure 2 is approximately the same as the substrate structure 1 of the first embodiment. The substrate structure 2 comprises a dielectric material layer 21, a first conductive wiring layer 13, a first conductive pillar layer 15, a second conductive wiring layer 17, and a second conductive pillar layer. The second conductive pillar layer has a plurality of second conductive pillars 23A, 23B. The second conductive pillar 19A has a first height H1 and the second conductive pillar 19B has a second height H2, wherein the second height H2 is less than the first height H1. The second conductive wiring layer 17 is disposed inside the dielectric material layer 21. The conductive pillars 23A, 23B of the second conductive pillar layer are partially disposed inside the dielectric material layer 21. In the embodiment, the conductive pillars 23A of the second conductive pillar layer are ╬-shaped conductive pillars. The conductive pillars 23B of the second conductive pillar layer are ╤-shaped conductive pillars.

Figure 3:
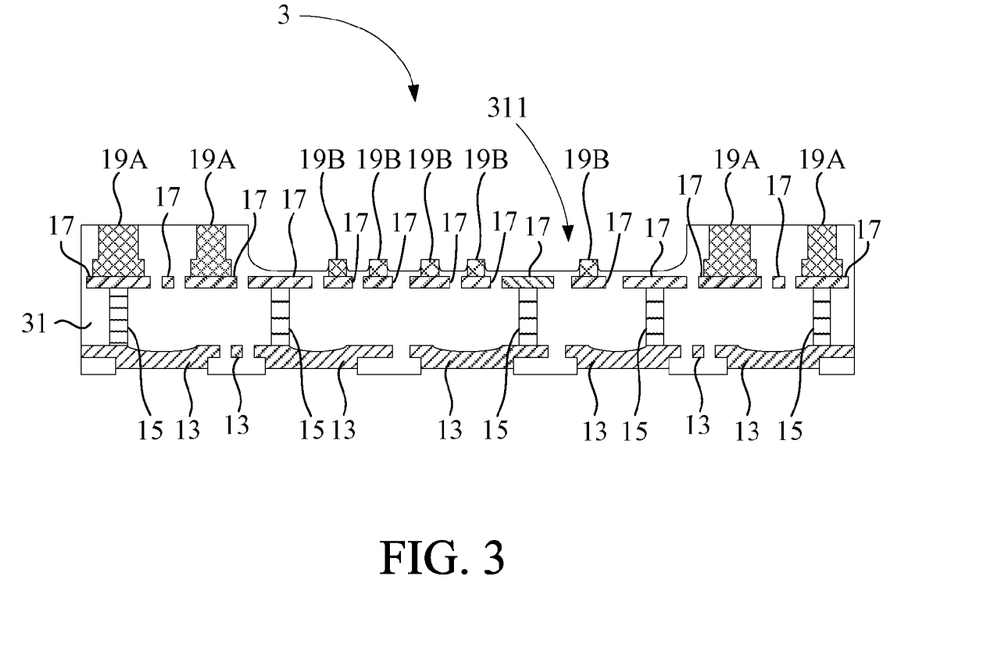
FIG. 3 is a schematic view of the third embodiment of a substrate structure of the present invention.

FIG. 3 depicts a substrate structure 3 of a third embodiment. The substrate structure 3 is approximately the same as the substrate structure 1 of the first embodiment. The substrate structure 3 comprises a dielectric material layer 31, a first conductive wiring layer 13, a first conductive pillar layer 15, a second conductive wiring layer 17, and a second conductive pillar layer. The dielectric material layer 31 has a depressed portion 311. The second conductive pillar layer has a plurality of conductive pillars 19A, 19B. The second conductive wiring layer 17 is disposed inside the dielectric material layer 31. The conductive pillars 19A of the second conductive pillar layer are disposed inside the dielectric material layer 31. A top of the conductive pillars 19A and a top of the dielectric layer 31 is flush. The conductive pillars 19B of the second conductive pillar layer are located at the depressed portion 311 and partially disposed inside the dielectric material layer 31. In the embodiment, the conductive pillars 19A of the second conductive pillar layer are ⊥-shaped conductive pillars. The conductive pillars 19B of the second conductive pillar layer are □-shaped conductive pillars.

Figure 4:
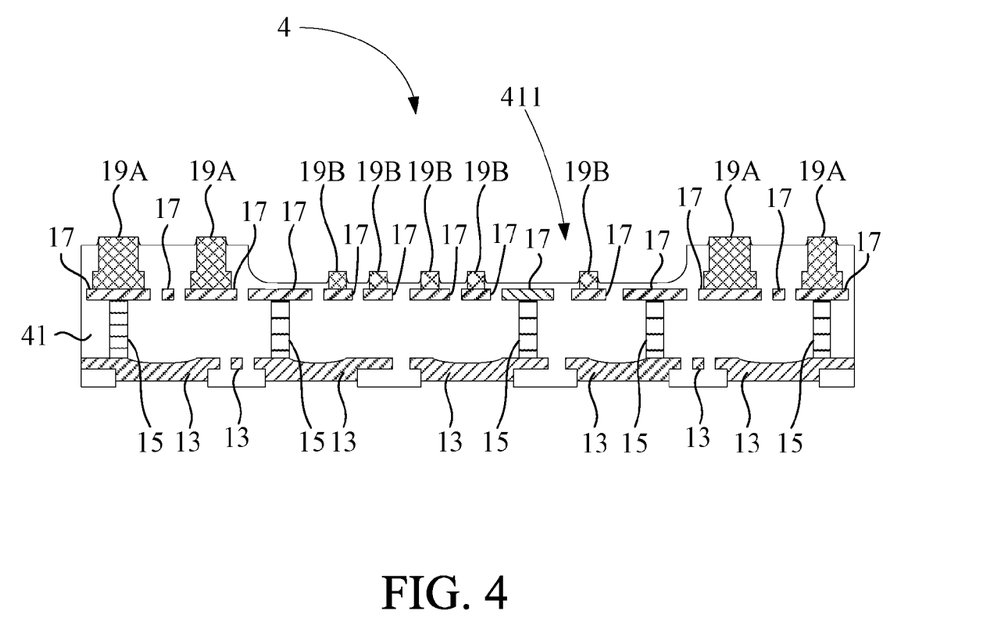
FIG. 4 is a schematic view of the fourth embodiment of a substrate structure of the present invention.

FIG. 4 depicts a substrate structure 4 of a fourth embodiment. The substrate structure 4 is approximately the same as the substrate structure 1 of the first embodiment. The substrate structure 4 comprises a dielectric material layer 41, a first conductive wiring layer 13, a first conductive pillar layer 15, a second conductive wiring layer 17, and a second conductive pillar layer. The dielectric material layer 41 has a depressed portion 411. The second conductive pillar layer has a plurality of conductive pillars 19A, 19B. The second conductive wiring layer 17 is disposed inside the dielectric material layer 41. The conductive pillars 19A, 19B of the second conductive pillar layer are partially disposed inside the dielectric material layer 41. In the embodiment, the conductive pillars 19A of the second conductive pillar layer are ⊥-shaped conductive pillars. The conductive pillars 19B of the second conductive pillar layer are □-shaped conductive pillars.

Figure 5:
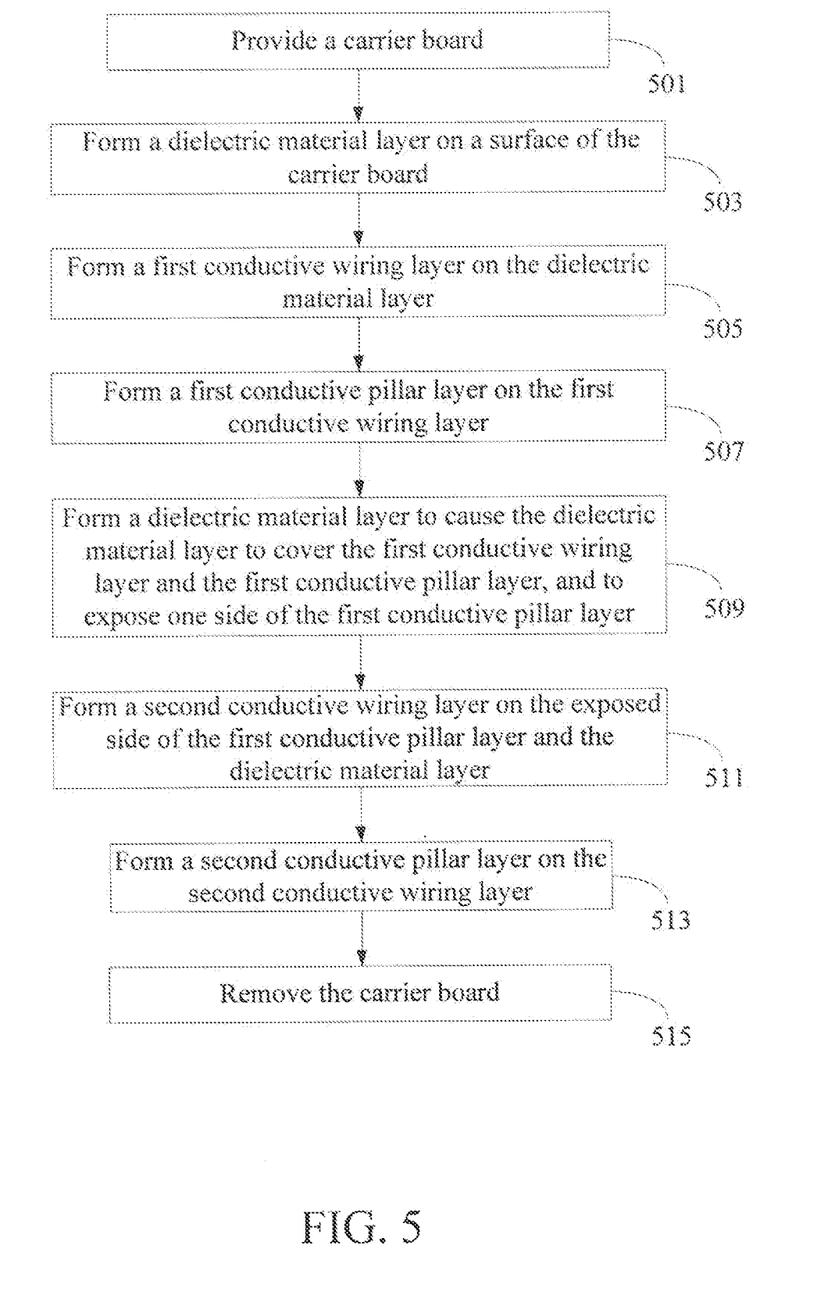
FIG. 5 is a flow chart of the fifth embodiment of a manufacturing method manufacturing a substrate structure of the present invention.

As shown in FIG. 5, a fifth embodiment of the present invention is a manufacturing method of a substrate structure. The manufacturing method is adapted for manufacturing the substrate structure 1 described in the first embodiment. The manufacturing method of the third embodiment will be illustrated via FIG. 5 and FIG. 6A to FIG. 6G.

Figure 6A:
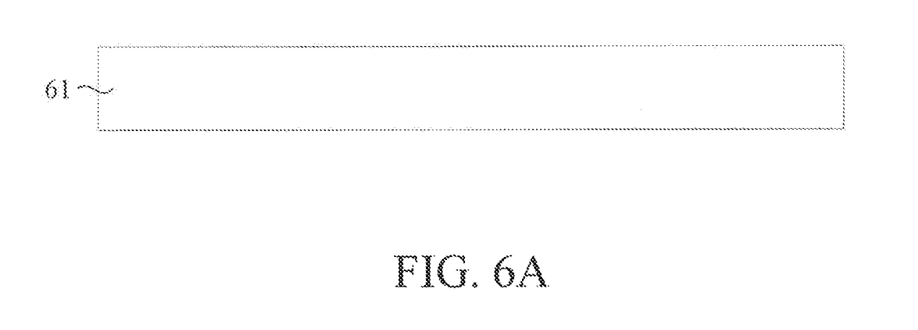
FIGS. 6A-6G are schematic views of the fifth embodiment of the manufacturing method manufacturing the substrate structure of the present invention.

The manufacturing method comprises the following steps. Initially, step 501 is executed to provide a carrier board 61, as shown in FIG. 6A. The carrier board 61 is a metal substrate made of aluminum, copper, stainless steel, or a combination of the aforesaid materials.

Figure 6B:
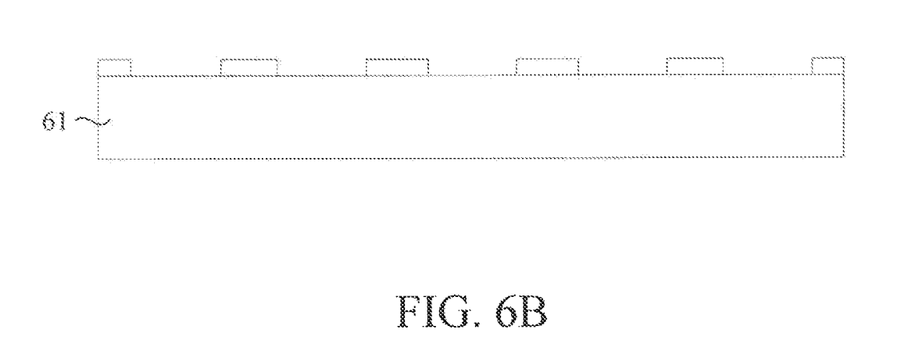

Step 503 is executed to form a dielectric material layer on a surface of the carrier board 6, as shown in FIG. 6B. More specifically, the dielectric material layer is formed on the surface of the carrier board 61 by vacuum lamination in step 503. Thus, only a single layer of dielectric material layer is formed by the vacuum lamination, which is suitable for a large area of packaging process, to reduce cost and production time.

Figure 6C:
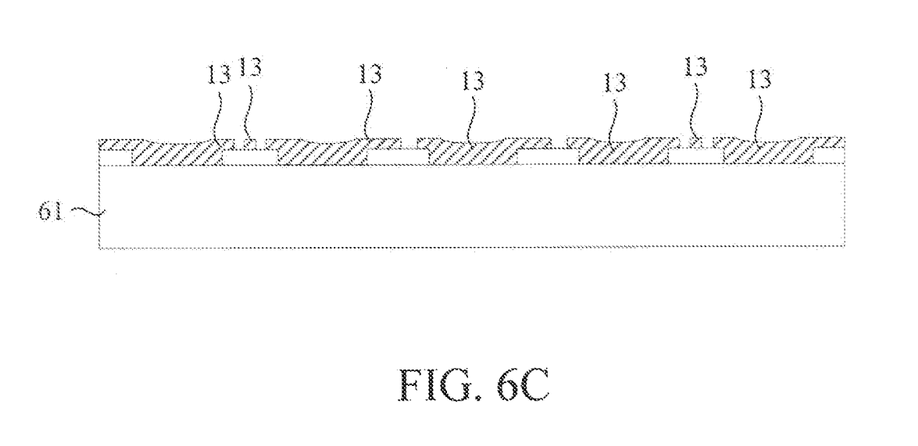
Figure 6D:
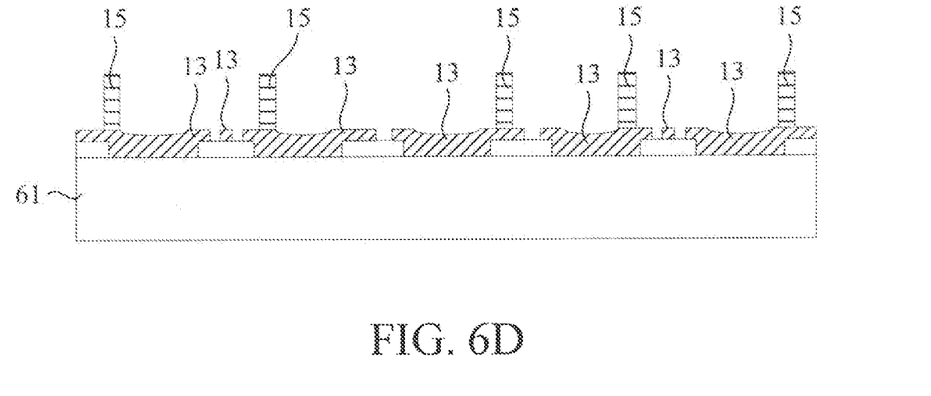
Figure 6E:
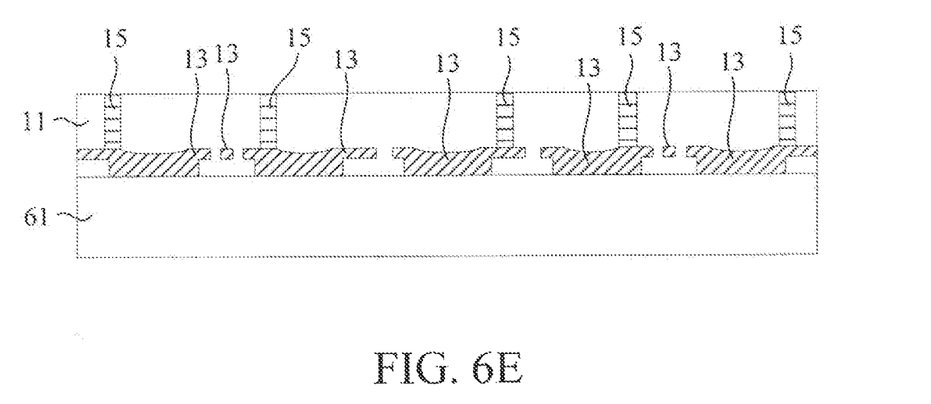

Step 505 is executed to form a first conductive wiring layer 13 on the dielectric material layer, as shown in FIG. 6C. Step 507 is executed to form a first conductive pillar layer 15 on the first conductive wiring layer 13, as shown in FIG. 6D. Step 509 is executed to form a dielectric material layer 11 to cause the dielectric material layer 11 to cover the first conductive wiring layer 13 and the first conductive pillar layer 15, and to expose one side of the first conductive pillar layer 15, as shown in FIG. 6E.

Figure 6F:
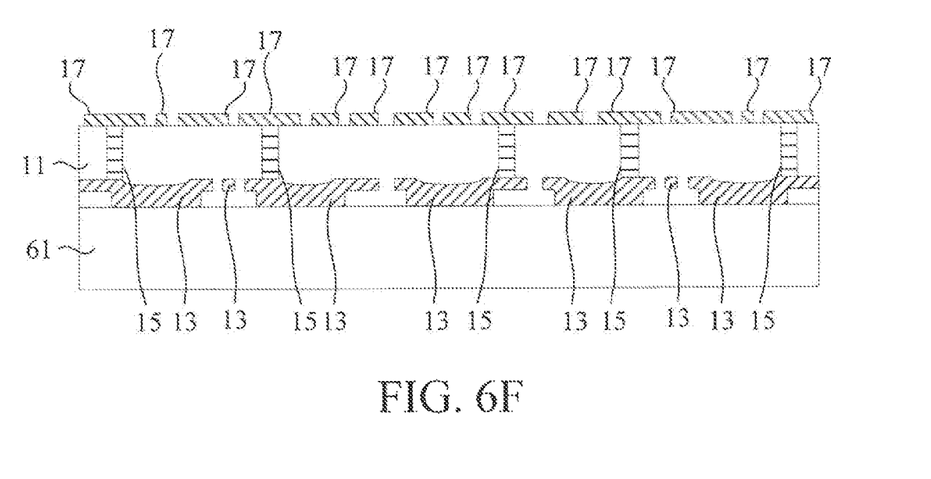
Figure 6G:
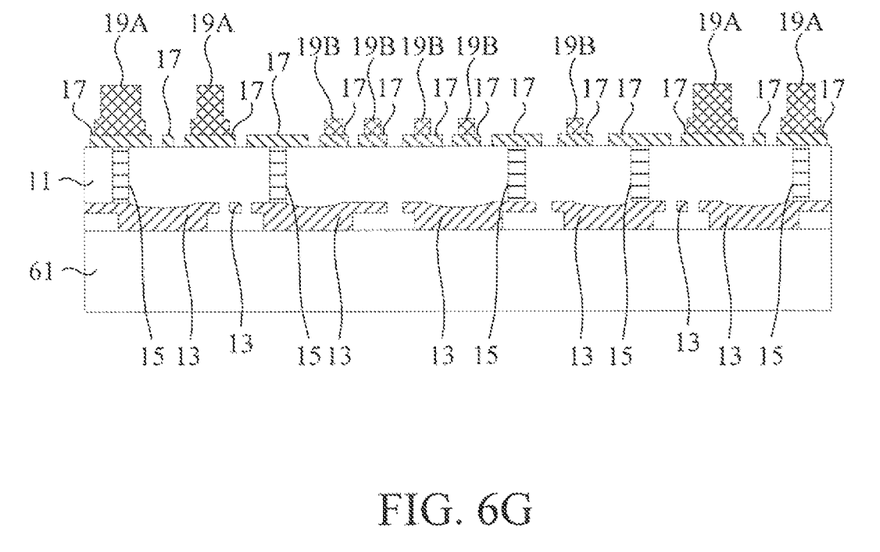

Step 511 is executed to form a second conductive wiring layer 17 on the exposed side of the first conductive pillar layer 15 and the dielectric material layer 11, as shown in FIG. 6F. Step 513 is executed to form a second conductive pillar layer, which has a plurality of conductive pillars 19A, 19B, on the second conductive wiring layer 17, as shown in FIG. 6G. The conductive pillars 19A of the second conductive pillar layer are ⊥-shaped conductive pillars. The conductive pillars 19B of the second conductive pillar layer are □-shaped conductive pillars. Finally, Step 515 is executed to remove the carrier board 61 to form the substrate structure 1 as shown in FIG. 1.

Figure 7:
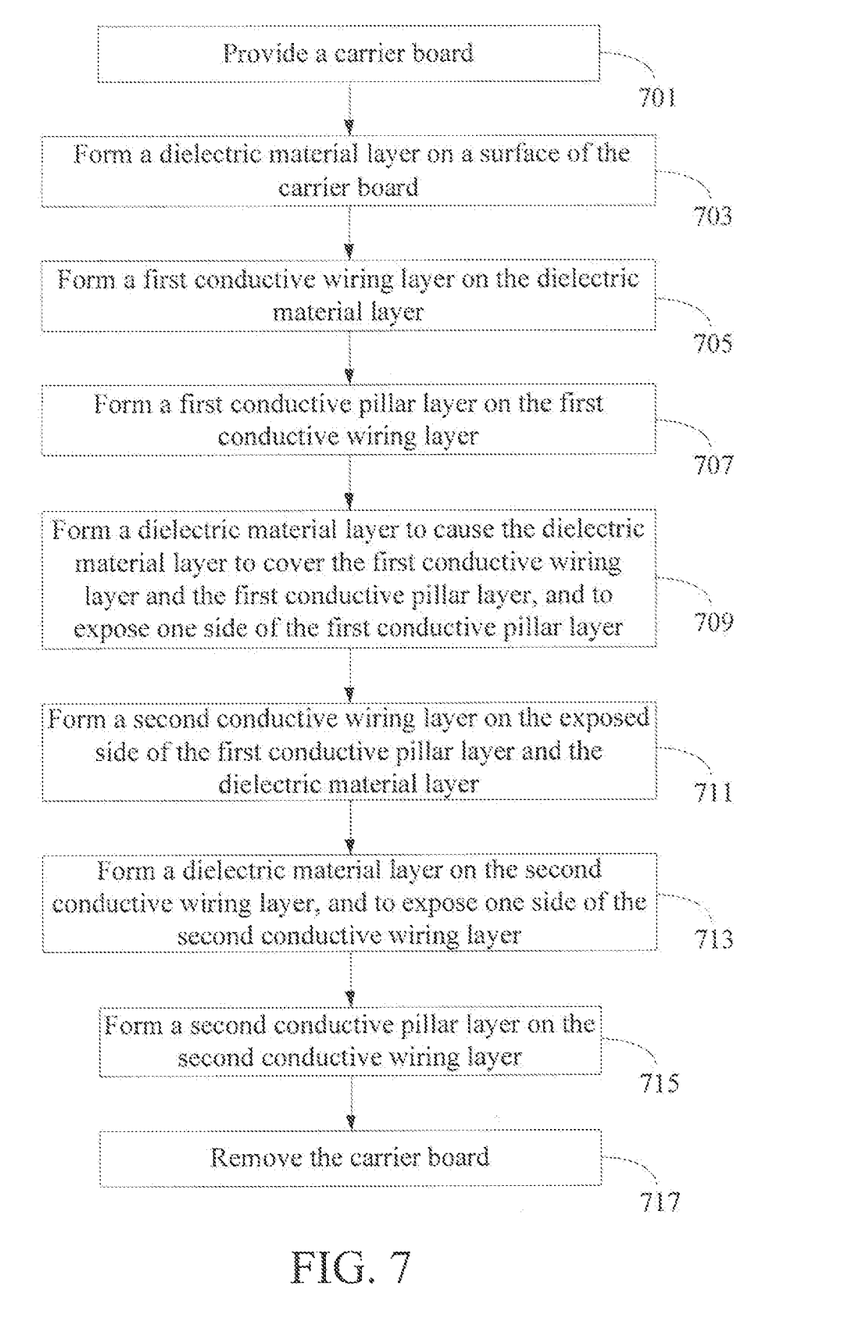
FIG. 7 is a flow chart of the sixth embodiment of a manufacturing method manufacturing a substrate structure of the present invention.

As shown in FIG. 7, a sixth embodiment of the present invention is a manufacturing method of a substrate structure. The manufacturing method is adapted for manufacturing the substrate structure 2 described in the second embodiment. The step 701 to step 711 of the sixth embodiment are the same as the step 501 to step 511 of the fifth embodiment. The subsequent steps of the manufacturing method of the sixth embodiment will be illustrated via FIG. 7 and FIG. 8A to FIG. 8B.

Figure 8A:
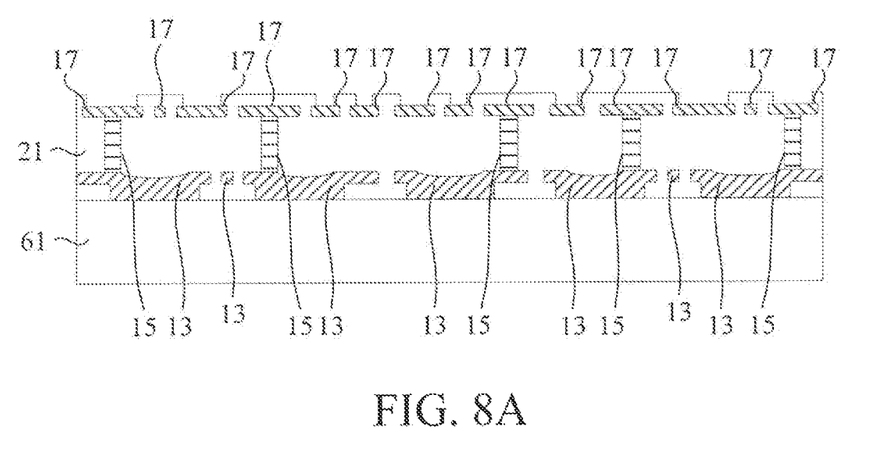
FIGS. 8A-8B are schematic views of the sixth embodiment of the manufacturing method manufacturing the substrate structure of the present invention.
Figure 8B:
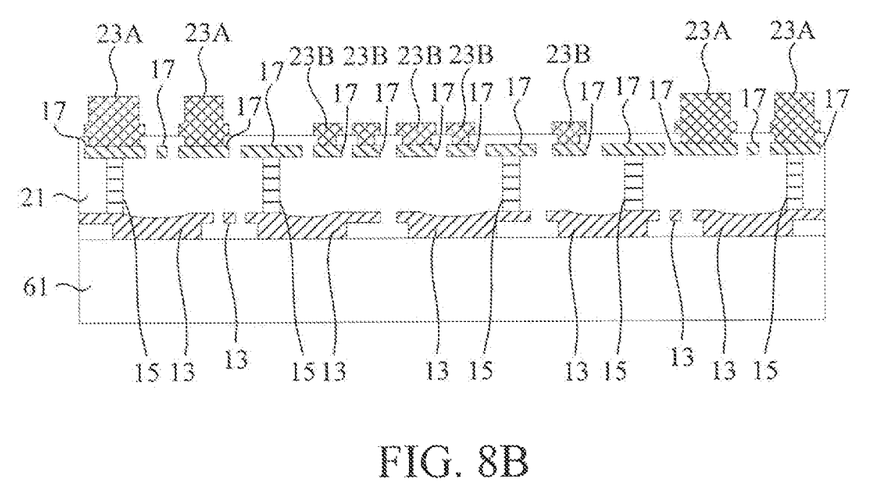

Step 713 is executed to form a dielectric material layer 21 on the second conductive wiring layer 17, and to expose one side of the second conductive wiring layer 17, as shown in FIG. 8A. Step 715 is executed to form a second conductive pillar layer, which has a plurality of conductive pillars 23A, 23B, on the second conductive wiring layer 17, as shown in FIG. 8B. The conductive pillars 23A of the second conductive pillar layer are ┴-shaped conductive pillars. The conductive pillars 23B of the second conductive pillar layer are ┬-shaped conductive pillars. Finally, Step 717 is executed to remove the carrier board 61 to form the substrate structure 2 as shown in FIG. 2.

Figure 9:
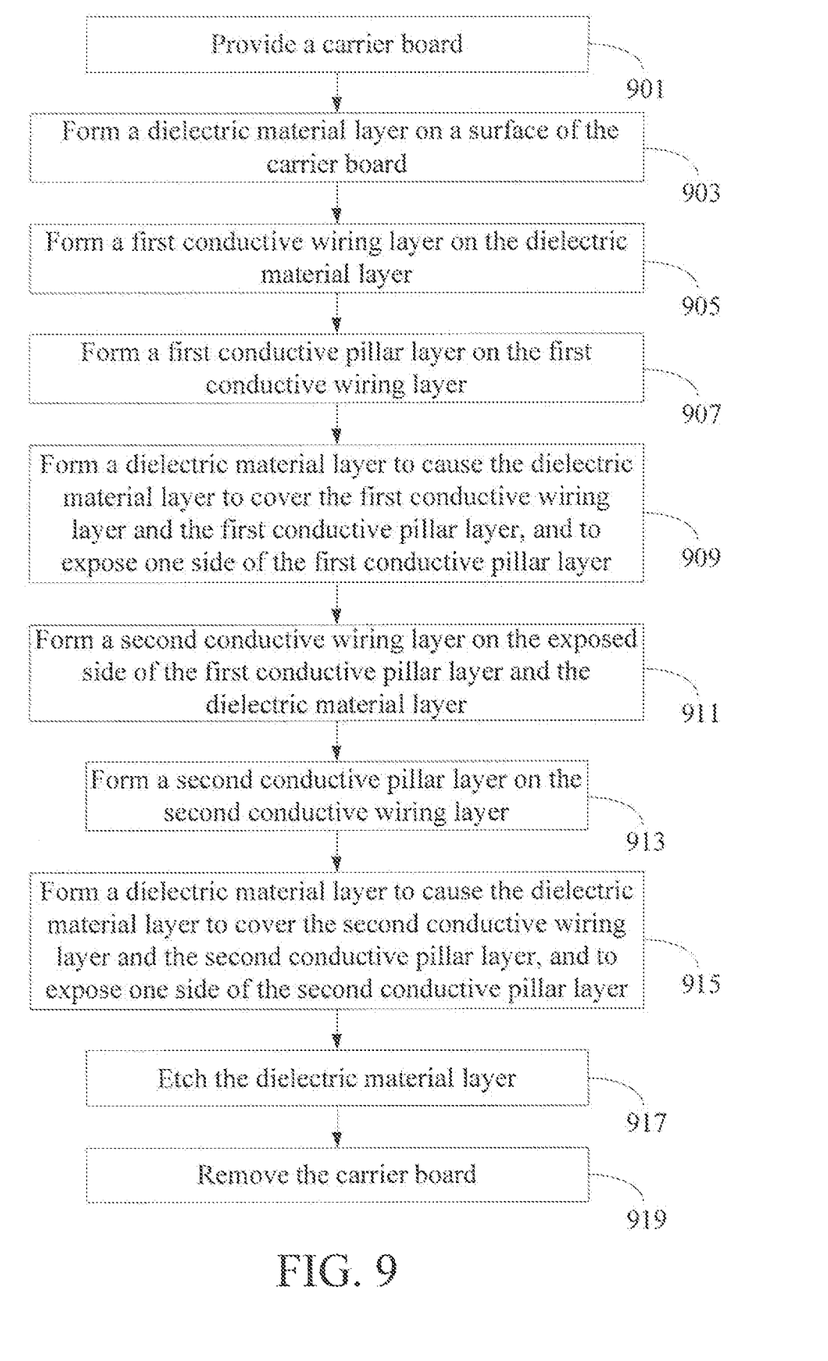
FIG. 9 is a flow chart of the seventh embodiment of a manufacturing method manufacturing a substrate structure of the present invention.

As shown in FIG. 9, a seventh embodiment of the present invention is a manufacturing method of a substrate structure. The manufacturing method is adapted for manufacturing the substrate structure 3 described in the third embodiment or the substrate structure 4 described in the fourth embodiment. The step 901 to step 913 of the seventh embodiment are the same as the step 501 to step 513 of the fifth embodiment. The subsequent steps of the manufacturing method of the seventh embodiment will be illustrated via FIG. 9, FIG. 10A to FIG. 10B, and FIG. 11.

Figure 10A:
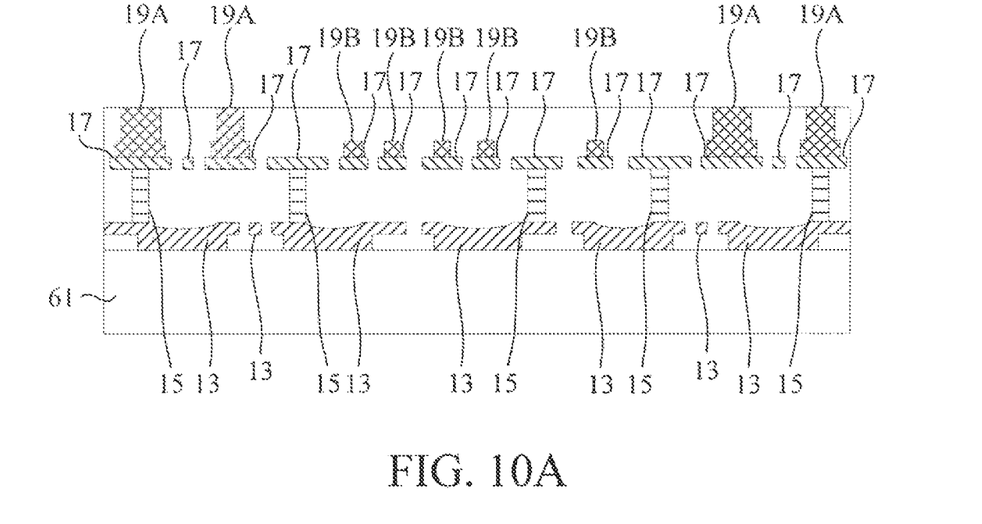
FIGS. 10A-10B are schematic views of the seventh embodiment of the manufacturing method manufacturing the substrate structure of the present invention.
Figure 10B:
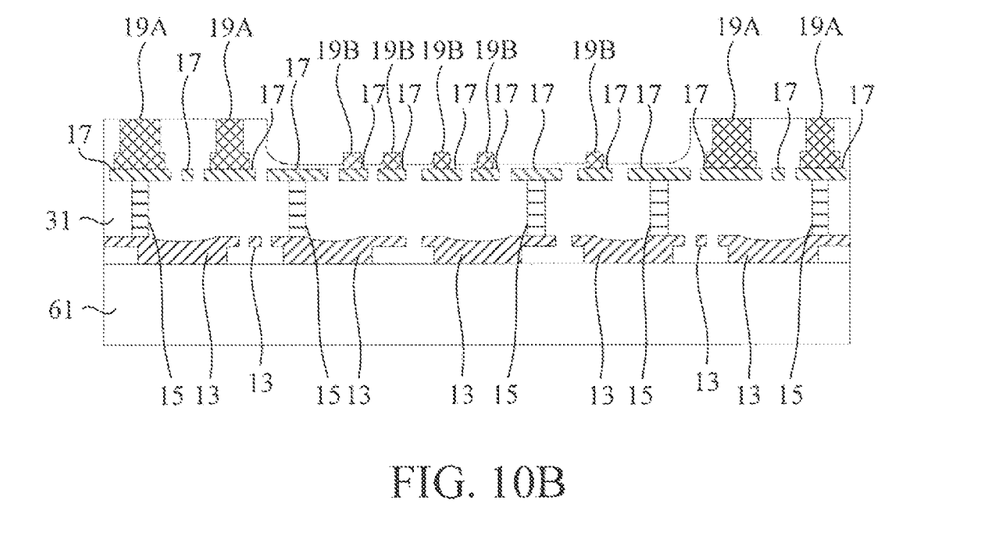

Step 915 is executed to form a dielectric material layer to cause the dielectric material layer to cover the second conductive wiring layer 17 and the second conductive pillar layer, and to expose one side of the second, conductive pillar layer, as shown in FIG. 10A. In the third embodiment, step 917 is executed to etch the dielectric material layer to form a dielectric material layer 31, as shown in FIG. 10B. The conductive pillars 19A of the second conductive pillar layer are disposed inside the dielectric material layer 31. The conductive pillars 19B of the second conductive pillar layer are partially disposed inside the dielectric material layer 31.

Figure 11:
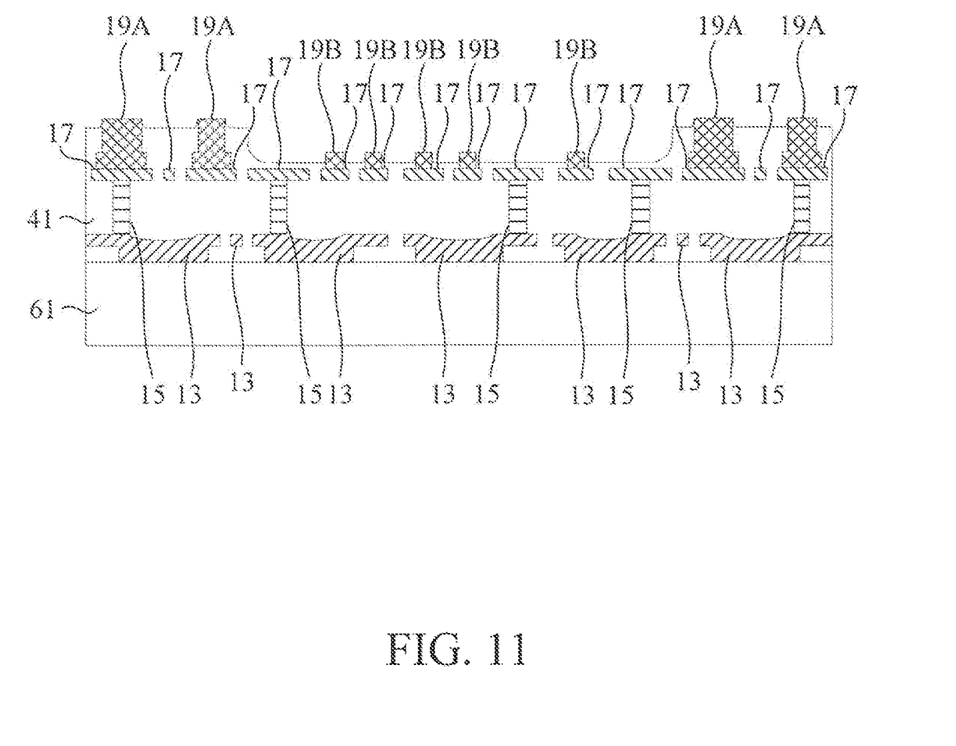
FIG. 11 is another schematic view of the seventh embodiment of the manufacturing method manufacturing the substrate structure of the present invention.

In the fourth embodiment, step 917 is executed to etch the dielectric material layer to form a dielectric material layer 41, as shown in FIG. 11. The conductive pillars 19A, 19B of the second conductive pillar layer are partially disposed inside the dielectric material layer 41.

Finally, Step 919 is executed to remove the carrier board 61 to form the substrate structure 3 as shown in FIG. 3 or the substrate structure 4 as shown in FIG. 4.

Figure 12:
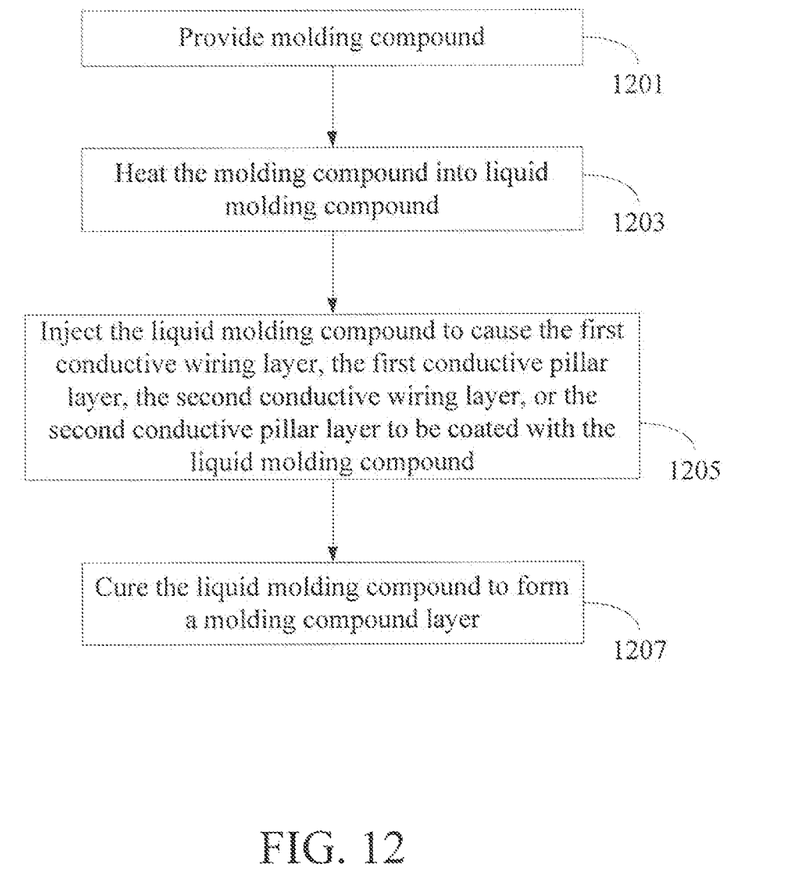
FIG. 12 is a flow chart of forming the dielectric material layer.

As shown in FIG. 12, the steps 509, 709, 713, 909, 915 of forming the dielectric material layer further comprise the following steps. Step 1201 is executed to provide molding compound. The molding compound is novolac-based resin, epoxy-based resin, silicone-based resin, or any molding compound with the same function and well known to those skilled in the art. Step 1203 is executed to heat the molding compound into liquid molding compound. Step 1205 is executed to inject the liquid molding compound to cause the first conductive wiring layer 13, the first conductive pillar layer 15, the second conductive wiring layer 17, or the second conductive pillar layer to be coated with the liquid molding compound. Finally, Step 1207 is executed to cure the liquid molding compound to form a molding compound layer.

According to the above description, the substrate structure and manufacturing method of the present invention use a simple manufacturing process to form conductive pillars with different shapes as supports between the inter-layers in a multilayer stack package. Accordingly, the substrate structure and manufacturing method of the present invention reduce a height of the multilayer stack package to achieve the high yield rate of packaging process, and increase rigidity and heat dissipation. Therefore, the processing time and cost of the substrate structure will be significantly reduced.

The above embodiments merely give the detailed technical contents of the present invention and inventive features thereof, and are not to limit the covered range of the present invention. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A substrate structure, comprising:
a dielectric material layer, having a depressed portion;
a first conductive wiring layer disposed inside the dielectric material layer;
a second conductive wiring layer;
a first conductive pillar layer, disposed inside the dielectric material layer and between the first and second conductive wiring layers, having at least one first conductive pillar electrically connected to the first and second conductive wiring layers; and
a second conductive pillar layer, disposed on the second conductive wiring layer and having at least two second conductive pillars, each of which is one of a ⊥-shaped conductive pillar, a ⊤-shaped conductive pillar, and a +-shaped conductive pillar,
wherein one of the second conductive pillar has a first height and another one of the second conductive pillar has a second height, which is less than the first height, and the second conductive pillar with the second height is located at the depressed portion and partially disposed inside the dielectric layer.

2. The substrate structure as claimed in claim 1, wherein the second conductive wiring layer is disposed inside the dielectric material layer, and the at least one second conductive pillar is partially disposed inside the dielectric material layer.

3. The substrate structure as claimed in claim 2, wherein the at least one second conductive pillar is disposed inside the dielectric material layer.

4. The substrate structure as claimed in claim 1, wherein the dielectric material layer is a molding compound layer having one of novolac-based resin, epoxy-based resin, and silicone-based resin.

5. The substrate structure as claimed in claim 1, wherein the second conductive pillar with the first height is partially disposed inside the dielectric material layer.

6. The substrate structure as claimed in claim 5, wherein a top of the second conductive pillar with the first height and a top of the dielectric layer is flush.

* * * * *